(12) United States Patent  
Yang et al.

(10) Patent No.: US 8,625,369 B1  
(45) Date of Patent: *Jan. 7, 2014

(54) DETERMINING THRESHOLD VOLTAGE DISTRIBUTION IN FLASH MEMORY

(71) Applicant: Marvell International Ltd., Hamilton (BM)

(72) Inventors: Xueshi Yang, Cupertino, CA (US); Zining Wu, Los Altos, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/690,371

(22) Filed: Nov. 30, 2012

Related U.S. Application Data

(60) Continuation of application No. 13/323,787, filed on Dec. 12, 2011, now Pat. No. 8,331,169, which is a division of application No. 12/552,925, filed on Sep. 2, 2009, now Pat. No. 8,077,520.

(60) Provisional application No. 61/094,781, filed on Sep. 5, 2008, provisional application No. 61/094,793, filed on Sep. 5, 2008, provisional application No. 61/094,798, filed on Sep. 5, 2008.

(51) Int. Cl.  
*G11C 7/00* (2006.01)

(52) U.S. Cl.  
USPC .................................. 365/189.15; 365/210

(58) Field of Classification Search  
USPC ............................... 365/189.15, 210  
See application file for complete search history.

(56) References Cited

U.S. PATENT DOCUMENTS

| | | | |
|---|---|---|---|
| 6,835,585 B2 | 12/2004 | Kim | |
| 6,853,585 B2 * | 2/2005 | Lee et al. | 365/185.22 |
| 7,139,961 B2 * | 11/2006 | Kravtchenko | 714/756 |
| 7,746,702 B2 | 6/2010 | Cho et al. | |
| 8,331,169 B1 * | 12/2012 | Yang et al. | 365/189.15 |

* cited by examiner

*Primary Examiner* — Son Dinh  
*Assistant Examiner* — Nam Nguyen

(57) ABSTRACT

Methods, apparatuses, and systems for comparing threshold voltages of a plurality of flash memory cells to a plurality of reference voltages. A number of flash memory cells having threshold voltages that fall within each bin of a plurality of bins is determined. The plurality of bins each represent a plurality of threshold voltage ranges. A threshold voltage distribution of the plurality of flash memory cells is calculated based at least in part on the number of flash memory cells that fall into each of the bins.

18 Claims, 10 Drawing Sheets

DETERMINING THRESHOLD VOLTAGE DISTRIBUTION IN FLASH MEMORY

CROSS REFERENCE TO RELATED APPLICATIONS

This present disclosure is a continuation of and claims priority to U.S. patent application Ser. No. 13/323,787, filed Dec. 12, 2011, now U.S. Pat. No. 8,331,169, issued Dec. 11, 2012, which is a divisional of and claims priority to U.S. application Ser. No. 12/552,925, filed on Sep. 2, 2009, now U.S. Pat. No. 8,077,520, issued Dec. 13, 2011, which claims priority under 35 U.S.C. §119(e) to U.S. Provisional Application No. 61/094,781, filed Sep. 5, 2008, U.S. Provisional Application No. 61/094,793, filed Sep. 5, 2008 and U.S. Provisional Application No. 61/094,798, filed Sep. 5, 2008, which are incorporated herein by reference.

TECHNICAL FIELD

Embodiments of the present invention relate to the field of digital memories and more particularly, to methods, apparatuses, and systems for determining threshold voltage distributions in flash memory.

BACKGROUND

Flash memory employs floating gate transistors in a plurality of memory cells. One or more charge levels may be programmed onto the floating gates of the floating gate transistors in order to store data. The threshold voltage level of a floating gate transistor depends on the level of charge programmed therein. Thus, the data stored within flash memory is read by comparing the threshold voltages of the floating gate transistors to one or more reference voltages. This mechanism is used in both single-bit and in multi-bit flash memories.

A floating-gate transistor is capable of storing a voltage on its "floating gate" for a period, typically many years. The threshold voltage of the floating-gate transistor will change depending on a value currently stored on the floating gate. In a single-bit flash cell, for example, the threshold voltage of the cell will be one of two voltages depending on the level of charge stored in the floating gate transistor. Thus, in some implementations of flash memory, the stored value is read by comparing the threshold voltage to a reference voltage. If the threshold voltage is less than the reference voltage, then the output is considered to be a first binary number (such as a 1). If the threshold voltage is greater than the reference voltage, the output is considered to be a second binary value (such as a 0). In a sense, a floating gate transistor has multiple threshold voltages, each exhibited only when a certain voltage is stored on the floating gate.

The levels of these multiple threshold voltages of a floating gate transistor will change over time due to physical changes after repeated erase and program cycles, or for other reasons. A group of flash memory cells will therefore exhibit a change in their overall threshold voltages distribution over time. And if the threshold voltages change as a memory device ages, then it can be useful to adjust the reference voltages used to read the memory cells as the device gets older. This can, for example, result in lower error rates. If the reference voltages are not varied, the device may exhibit higher error rates as it ages.

The description in this section is related art, and does not necessarily include information disclosed under 37 C.F.R. 1.97 and 37 C.F.R. 1.98. Unless specifically denoted as prior art, it is not admitted that any of the described related art is prior art.

SUMMARY

Embodiments of the disclosure include methods, apparatuses, and systems for comparing threshold voltages of a plurality of flash memory cells to a plurality of reference voltages. A number of flash memory cells having threshold voltages that fall within each bin of a plurality of bins are determined. The plurality of bins each represent a plurality of threshold voltage ranges. A threshold voltage distribution of the plurality of flash memory cells is calculated based at least in part on the number of flash memory cells that fall into each of the bins.

Using this information, a threshold voltage distribution may be calculated using the mean and standard deviation of the threshold voltage distribution. In various embodiments, an ideal or near-ideal reference voltage is calculated based at least on the determined mean or standard deviation. In various embodiments, operations are performed on at least one of the plurality of memory cells using this ideal or near-ideal reference voltage. Such operations may include a read, a program, or an erase operation. During the threshold calculation process, a plurality of reference voltages is provided in a sequential manner. The calculations can be based, at least in part, on known storage levels of the plurality of flash memory cells. As for the bins, boundaries between at least two of the bins can be defined by one of the plurality of reference voltages.

Apparatuses according to embodiments include a memory bank comprising a plurality of flash memory cells and control circuitry coupled to the reference voltage generator and the memory bank. The control circuitry is configured to command the memory bank to compare threshold voltages of the plurality of flash memory cells to a plurality of reference voltages. The control circuitry will determine, based at least on the comparison results, a number of the plurality of flash memory cells having threshold voltages that fall within each of a plurality of bins. The bins represent a plurality of threshold voltage ranges. The control circuit is also configured to calculate a mean and standard deviation of a threshold voltage distribution of the plurality of flash memory cells based at least in part on the number of flash memory cells that fall into each of the bins.

Apparatuses include a reference voltage generator configured to provide the memory bank with the plurality of reference voltages. The reference voltage generator includes a digital-to-analog-converter configured to accept a digital input and to generate an analog voltage corresponding to the digital input. The control circuitry is further configured to calculate an ideal or near-ideal reference voltage based at least in part on the determined mean and standard deviation. The control circuitry is also configured to perform an operation on at least one of the plurality of memory cells using the ideal or near-ideal reference voltage.

Embodiments include memory controllers with an input/output interface configured to interface with a memory device. The memory controllers include microcircuits configured to receive a plurality of comparison results from the memory device. The comparison results represent comparisons between threshold voltages of a plurality of flash memory cells and a plurality of reference voltages. The memory controller may determine, based at least on the received comparison results for each bin of a plurality of bins, a number of flash memory cells having threshold voltages that fall within each bin. The plurality of bins represent a plurality of threshold voltage ranges. The memory controller may calculate a mean and standard deviation of a threshold voltage distribution of the plurality of flash memory cells based at least in part on the number of flash memory cells that fall into each of the bins.

Methods according to embodiments also include iteratively performing read operations on a plurality of flash memory cells until a condition is met. Each successive read operation utilizes a different reference voltage. Two or more read results of the iterative read operations may be synthesized to determine data for output. The condition may be, for example, that an error correction code decode failure has occurred. The synthesizing includes quantizing the two or more read results. The plurality of reference voltages may be iteratively received, or the plurality of reference voltages may be generated based on a received digital input.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the present invention, the phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Methods, apparatuses, systems, and memory controllers for estimating a threshold voltage distribution in a flash memory are described herein. In various embodiments, the threshold voltages of the flash memory cells are compared to various reference voltages. This may be accomplished, for example, by reading the contents of the memory cells multiple times using a range of discrete reference voltages. Once the results of these comparisons are collected, the numbers of memory cells with threshold voltages that fall into a number of "bins" are determined. Each bin represents a range of threshold voltages. One of several known statistical techniques can be used to determine the threshold voltage distribution of the cells based on the numbers of memory cells falling into each bin. Determining the threshold voltage distribution may include determining the mean and standard deviation of the threshold voltages of the flash memory cells. An optimal or near-optimal reference voltage is determined based on the determined threshold voltage distribution, using for example the mean and/or the standard deviation of the threshold voltage distribution.

Figure 1:
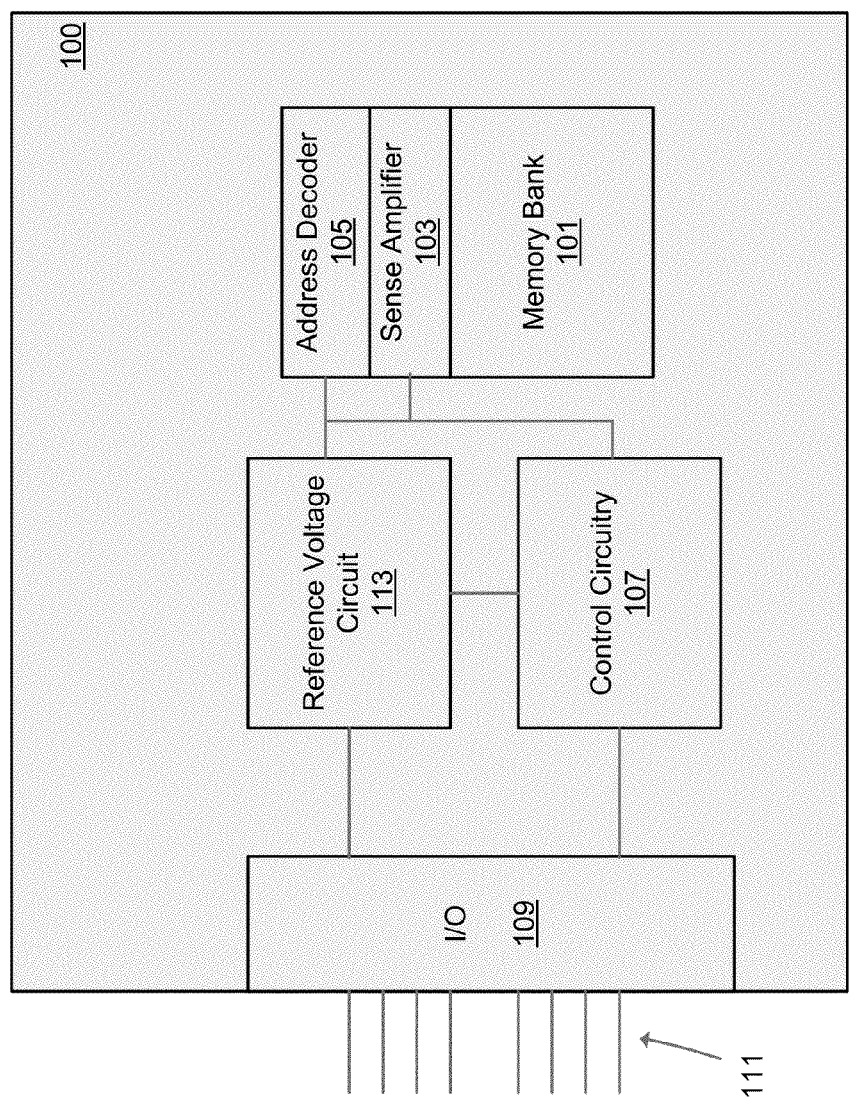
FIG. 1 illustrates a memory device configured to compare the threshold voltages of its memory cells to a plurality of reference voltages in accordance with various embodiments of the present invention.

FIG. 1 illustrates a memory device 100 configured to compare the threshold voltages of its memory cells to a plurality of reference voltages in accordance with various embodiments of the present invention. Memory device 100 includes memory bank 101 which has a plurality of memory cells. These memory cells may be, for example, flash memory cells. These memory cells may be normally used to store data, and thus may not be "pilot" cells. Memory bank 101 is coupled to sense amplifier 103 and to address decoder 105. It will be understood that there may be more than one memory bank, sense amplifier and/or address decoder; one of each is shown for the sake of illustration.

Control circuitry 107 is configured to operate memory device 100. Control circuitry 107 is configured to receive memory access commands and associated memory addresses from external devices via input/output (I/O) 109 and I/O pins 111. Control circuitry 107 may be a microcircuit. Control circuitry 107 is configured to cause sense amplifier 103 to iteratively compare threshold voltages of some or all of the plurality of memory cells within memory bank 101 to a plurality of reference voltages. Reference voltage circuit 113 may be configured to generate the reference voltages.

Control circuitry 107 is configured to receive results of the compares and to determine, based on those comparison results, the numbers of memory cells that fall into each of a plurality of bins. Each bin represents a range of threshold voltages, as will be discussed in more detail elsewhere within this Detailed Description. Control circuitry 107 is configured to use statistical techniques to determine a threshold voltage distribution of the memory cells based at least on the numbers of memory cells that fall into each bin. This threshold voltage distribution may include both a mean threshold voltage and/or a standard deviation of the distribution. Control circuit 107 is configured to calculate an ideal or near-ideal reference voltage for performing operations on the memory cells based at least on the determined threshold voltage distribution. Control circuit 107 is configured to program reference voltage circuit 113 and/or sense amplifier 103 (or other components of memory device 100 shown or not shown) to use the ideal or near-ideal reference voltage to perform these operations.

Alternatively, control circuit 107 may be configured to transmit, via I/O 109 for example, the results of the compares to an external device, such as a memory controller or other device. Such embodiments will be discussed elsewhere within this Detailed Description, in particular with reference to FIG. 2.

Flash memories configured to accept a reference voltage signal for use for various purposes are herein described. These flash memories are configured to accept the reference voltage signal either on a specified pin or as data input, such as on the address and/or data pins of the flash memory device. Some embodiments may include a Digital-to-Analog Converter (DAC) configured to convert the reference voltage signal into a reference voltage. The reference voltage signal provided to the memory device may change responsive to changing operating conditions, such as device temperature, device age, or other conditions.

Flash memories configured to perform a progressive read are herein described. Flash memories so configured can read a group of memory cells—such as a memory page—at a first reference voltage and to check an ECC (error correction code) circuit to detect and/or correct any errors in the read result. If there is an ECC decoding failure, one or more reference voltages are used to re-read the page. Quantization may be used to attempt to determine the bits stored in the memory cells. This process may be repeated until there is no ECC decoding error. In some embodiments, the process may end upon reaching a predetermined maximum number of read iterations, or a maximum read time, even if no error-free output is determined.

Figure 2:
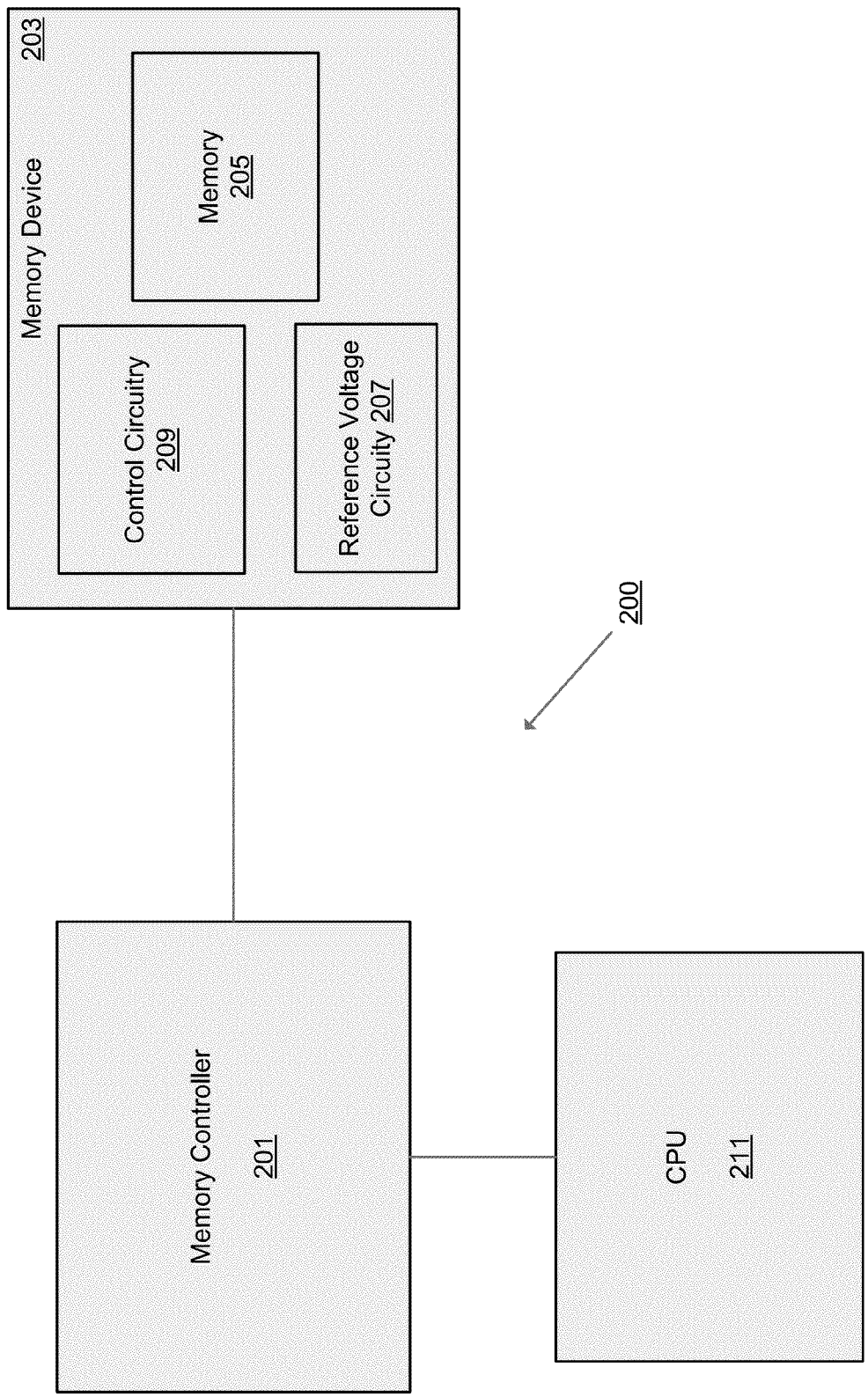
FIG. 2 illustrates a system including a memory controller for determining the threshold voltage distribution of a plurality of memory cells in accordance with various embodiments.

FIG. 2 illustrates a system 200 including a memory controller 201 for determining the threshold voltage distribution of a plurality of memory cells in accordance with various embodiments. System 200 includes memory device 203 which may include memory bank 205, reference voltage circuit 207, and control circuit 209. Memory controller 201 is configured to interface with memory device 203 to provide other devices with access to memory device 203; other devices may include, for example, central processing unit (CPU) 211.

Memory controller 201 is configured to command memory device 203 to compare the threshold voltages of some or all of the memory cells within memory bank 205 to a plurality of reference voltages. Memory controller is configured to pass these commands to control circuitry 209 and/or reference voltage circuit 207. Control circuitry 209 may be a microcircuit. Memory controller 201 is configured to receive results of these comparisons and determine the numbers of the memory cells having threshold voltages that fall into a number of bins representing threshold voltage ranges, as described elsewhere within this Detailed Description. Memory controller 201 is configured to determine a threshold voltage distribution of the memory cells as described elsewhere within this Detailed Description. Memory controller 201 is configured to calculate an ideal or near-ideal reference voltage based at least on the numbers of memory cells falling into each of the plurality of bins (raw bin count), and to provide the ideal or near-ideal reference voltage to memory device 203.

Whether it is the memory controller, the memory device, or some other device that determines the numbers of memory cells that fall into each bin of threshold voltage ranges, statistical techniques can be used to take the raw bin count and determine a threshold voltage distribution.

Each compare result includes the number of memory cells that have a threshold voltage below the reference voltage, and the number of memory cells that have a threshold voltage above the reference voltage. By synthesizing the results from all of the comparison operations, it can be determined how many memory cells "flip" their read result somewhere between each reference voltage used. Each bin represents a range of threshold voltages between two of the reference voltages, or a range of threshold voltages that are either above or below a highest or lowest reference voltage.

Figure 3:
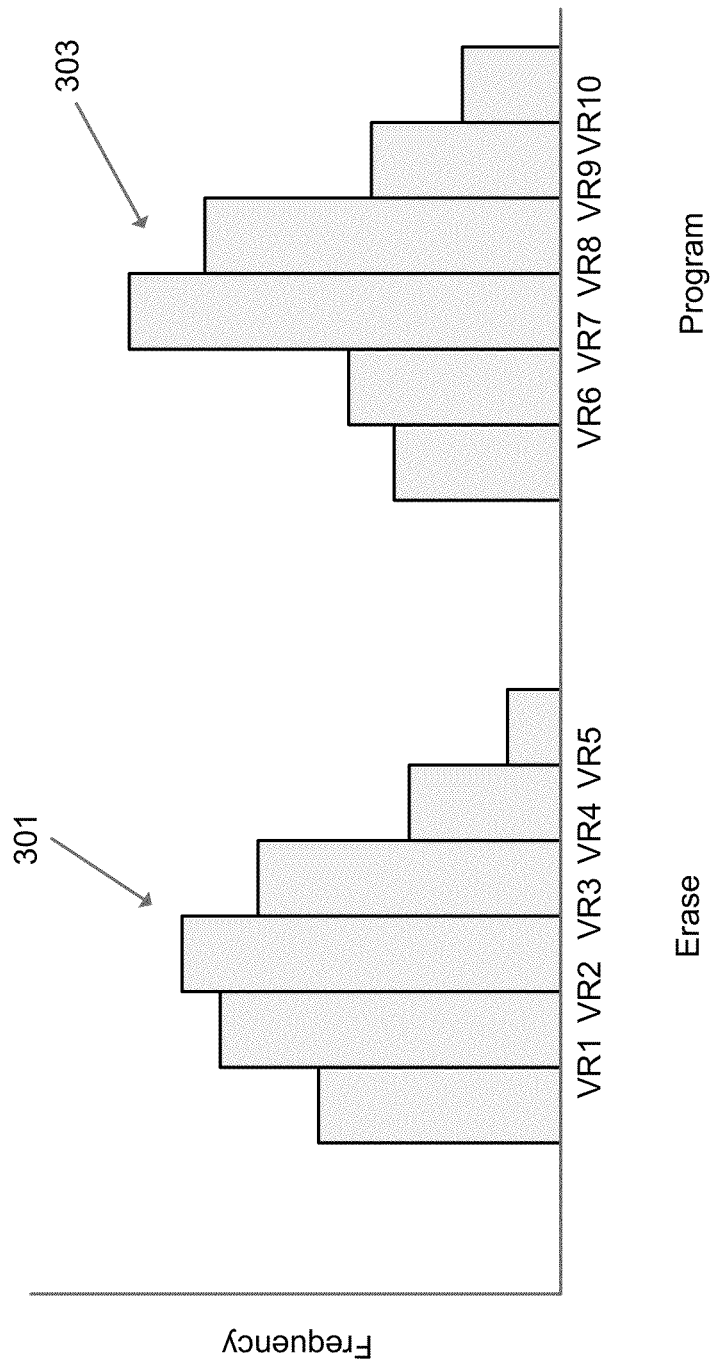
FIG. 3 illustrates a bin count of threshold voltages of a plurality of memory cells that may be used to determine a threshold voltage distribution in accordance with various embodiments of the present invention.

FIG. 3 illustrates bin counts of threshold voltages of a plurality of memory cells that may be used to determine a threshold voltage distribution in accordance with various embodiments of the present invention. Because in a single-bit memory cell some of the memory cells will contain a binary 1 and others will contain a binary 0, FIG. 3 shows two distributions. In the example shown in FIG. 3, each erase bin 301 represents a range of threshold voltage ranges for those memory cells that have been erased. Each program bin 303 represents a range of threshold voltage ranges for those memory cells that have been programmed, and thus have a relatively higher threshold voltage than the erased memory cells. In this example, the borders between bins are determined by one of the reference voltages ($V_{rx}$) used to perform the comparisons.

Statistical techniques can be used to determine the mean and standard deviations from the raw bin counts. For example a weighted count around each peak can be used to estimate the mean. Curve-fitting techniques can be used to calculate the probability density function of the reference voltage distribution. Also, the statistically-derived mean and standard deviation may be used to determine an ideal or non-ideal reference voltage for use in reading the memory cells.

In various embodiments, the actual values—or at least the relative distributions of the actual values—stored in the flash memory cells may be known. Known values may be programmed to the flash memory cells, or designated subsets of the flash memory cells, prior to performing the comparisons. For example, 50% of the memory cells may be programmed as a binary "1" while 50% may be programmed as a binary "0". This can make the statistical analysis easier. It is not required, however, that the actual values, or their relative distributions, be known. It is also not required to program 50% of both binary 1s and 0s. Some other distribution may be used—such as for example a 70:30 distribution ratio—and the bin counts can be normalized using known statistical techniques. It will be recognized that embodiments are not limited to any one particular statistical technique; nor are embodiments limited to a subset of statistical techniques.

Statistical techniques such as curve fitting or other techniques may be used to determine a mean and/or a standard deviation of the threshold voltage distributions. An ideal or near-ideal reference voltage for performing read operations on the memory cells can be determined from the threshold voltage distributions. A method for doing so is described in U.S. application Ser. No. 11/738,263. It will be noted that embodiments may be used to determine raw bins counts for multi-bit flash memories. In such cases, there will be three or more distributions. In such embodiments, multiple ideal or near-ideal reference voltages may be determined for performing the read operations using the raw bin counts.

U.S. application Ser. No. 11/738,263, filed Apr. 20, 2007, titled "Channel Estimation for Multi-Level Memories Using Pilot Signals" describes using pilot cells to estimate the mean and standard deviation of memory cells' threshold voltages in a flash memory. U.S. application Ser. No. 11/738,263 also describes how to compute an optimal or near-optimal reference voltage from these estimates. In other words, the mean threshold values and standard deviation that are estimated from the pilot cells are used to calculate an ideal or near-ideal reference voltage to use on those memory cells. The optimal detected threshold can be determined by the intersection points of adjacent probability density functions. U.S. application Ser. No. 11/738,263 is hereby incorporated herein in its entirety for all purposes.

Figure 4:
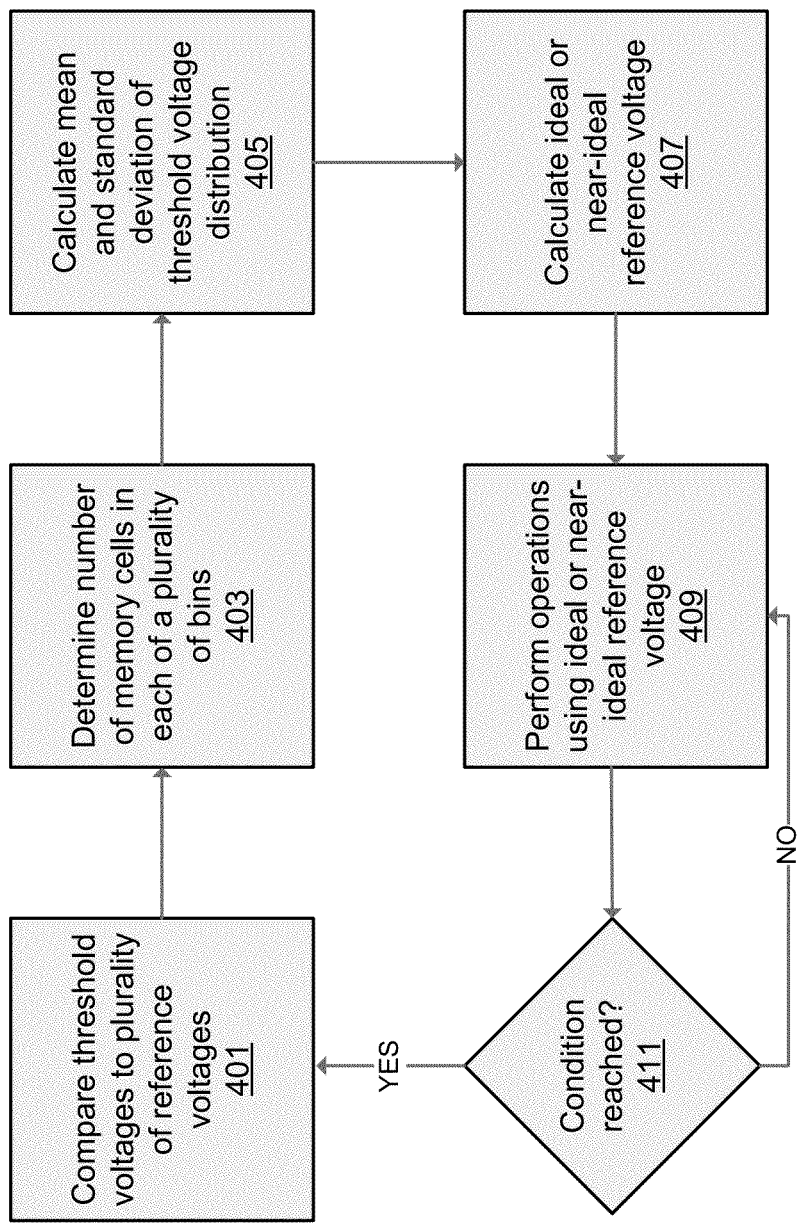
FIG. 4 illustrates a method for determining a threshold voltage distribution of a plurality of memory cells in accordance with exemplary embodiments of the invention.

FIG. 4 illustrates a method for determining a threshold voltage distribution of a plurality of memory cells in accordance with exemplary embodiments of the invention. At 401, the threshold voltages of a plurality of memory cells are compared to a plurality of reference voltages. At 403, the results of these comparisons are then synthesized to determine the numbers of memory cells with threshold voltages that fall into a plurality of bins that represent a range of threshold voltage ranges. At 405, the numbers of memory cells falling into each of the bins is used to determine a threshold voltage distribution, such as by calculating a standard deviation and/or a mean of the threshold voltages. At 407, the threshold voltage distribution (or distributions) can be used to calculate ideal or near-ideal reference voltages for performing read operations on the memory cells.

At 409, once the ideal or near-ideal reference voltage has been calculated, it can be used to perform the operations on the memory cells. At 411, the reference voltage may be used until a condition is met. The condition may be that a certain amount of time has passed, or that a certain number of erase/program cycles has occurred. Once the condition is met, the process may move to 401 and repeat.

As described above, memory devices according to embodiments may be configured to generate their own reference voltages. They may also be configured to receive their reference voltages from an external source, such as from a memory controller (memory controllers according to embodiments may be configured to provide such reference voltages). They may also be configured to receive a digital value and to convert that digital value into an analog voltage for use as a reference voltage. Memory devices may be configured to use these received voltages for performing a plurality of comparisons as described elsewhere within this Detailed Description for the purpose of determining a threshold voltage distribution of a plurality of memory cells, or they may be configured to use these reference voltages as reference voltages for performing actual read operations on memory cells.

Figure 5:
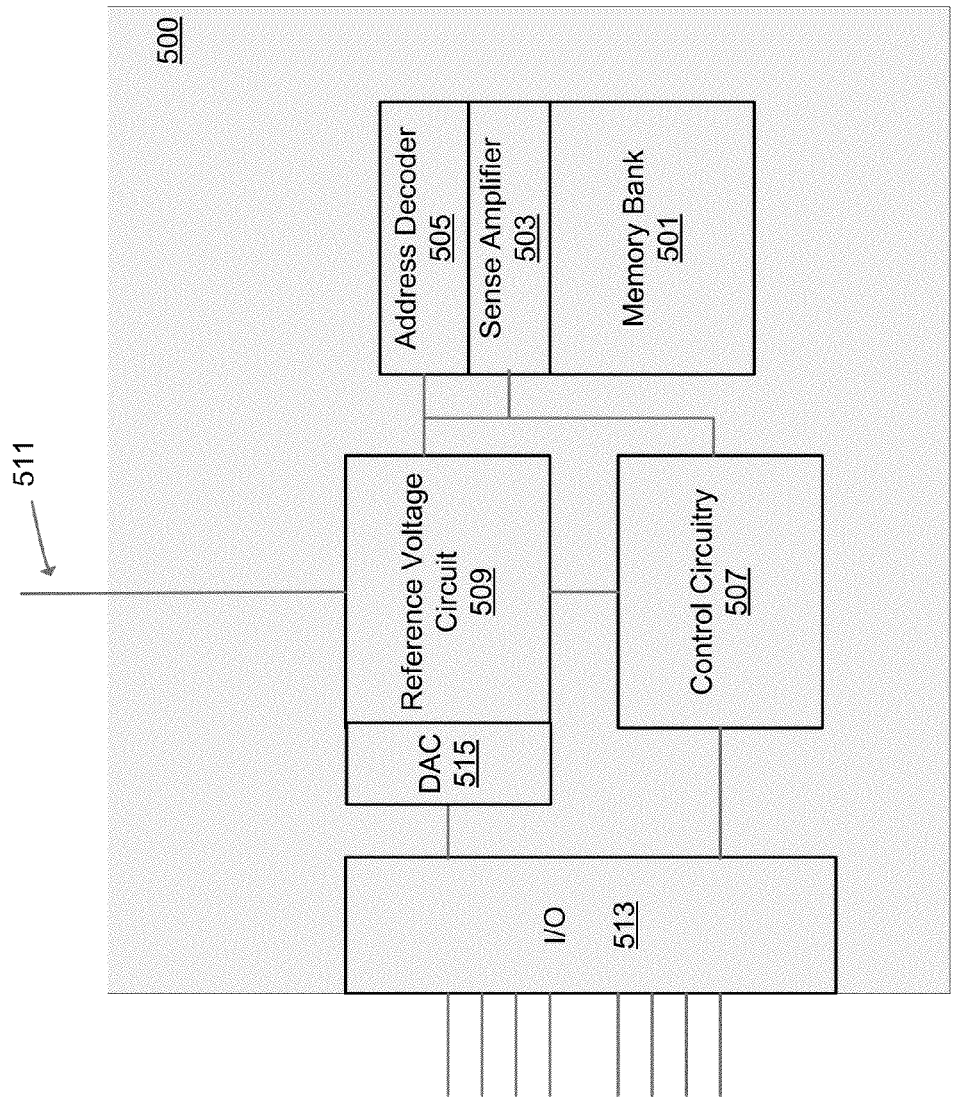
FIG. 5 illustrates a memory device configured to receive an external reference voltage signal in accordance with various embodiments.

FIG. 5 illustrates a memory device 500 configured to receive an external reference voltage signal in accordance with various embodiments. Memory device 500 may include memory bank 501, sense amplifier 503, address decoder 505, and control circuitry 507. Memory device 500 may include a reference voltage circuit 509 configured to receive a voltage signal on reference voltage pin 511. Reference voltage circuit 509 may be configured to provide this voltage signal, or a voltage derived from this voltage reference signal, to other components within memory device 500—such as sense amplifier 503—for performing read operations or other operations on memory cells within memory bank 501. Other operations include erase verify and program verify.

Alternatively, reference voltage circuit 509 may be configured to receive a reference voltage signal via I/O 513. Reference voltage circuit 509 may be configured to convert the reference voltage signal to a reference voltage via digital-to-analog converter (DAC) 515. Memory device 500 may be configured to receive a command via I/O 513 to treat the reference voltage input on I/O 513 as a reference voltage signal, rather than an address or other command. Alternatively, reference voltage circuit 509 may utilize a look-up table (not shown) to determine the reference voltage associated with the reference voltage signal.

Flash memories according to embodiments can be configured to accept two different operation commands. For example, the flash memory may be configured to interpret a first read command type as a command to perform a read operation utilizing an internal or default reference voltage. The flash memory may also be configured to interpret a second read command type as a command to perform a read operation utilizing an externally-provided reference voltage, or a reference voltage derived from an externally-provided signal. In the latter case, the flash memory may be configured to receive (and a memory controller or other device configured to provide) a reference voltage signal to the flash memory prior to receiving the second read command type. The flash memory may be configured to then use a reference voltage associated with the reference voltage signal to perform the read operation.

In an alternative implementation, the reference voltage signal may be received as a part of the read command itself, and the memory device may be configured to receive and interpret such a reference voltage signal.

In addition to performing multiple threshold voltage comparisons in order to determine an ideal or near-ideal reference voltage as discussed elsewhere within this Detailed Description, embodiments may perform multiple threshold voltage comparisons on demand as part of a progressive read operation.

Figure 6:
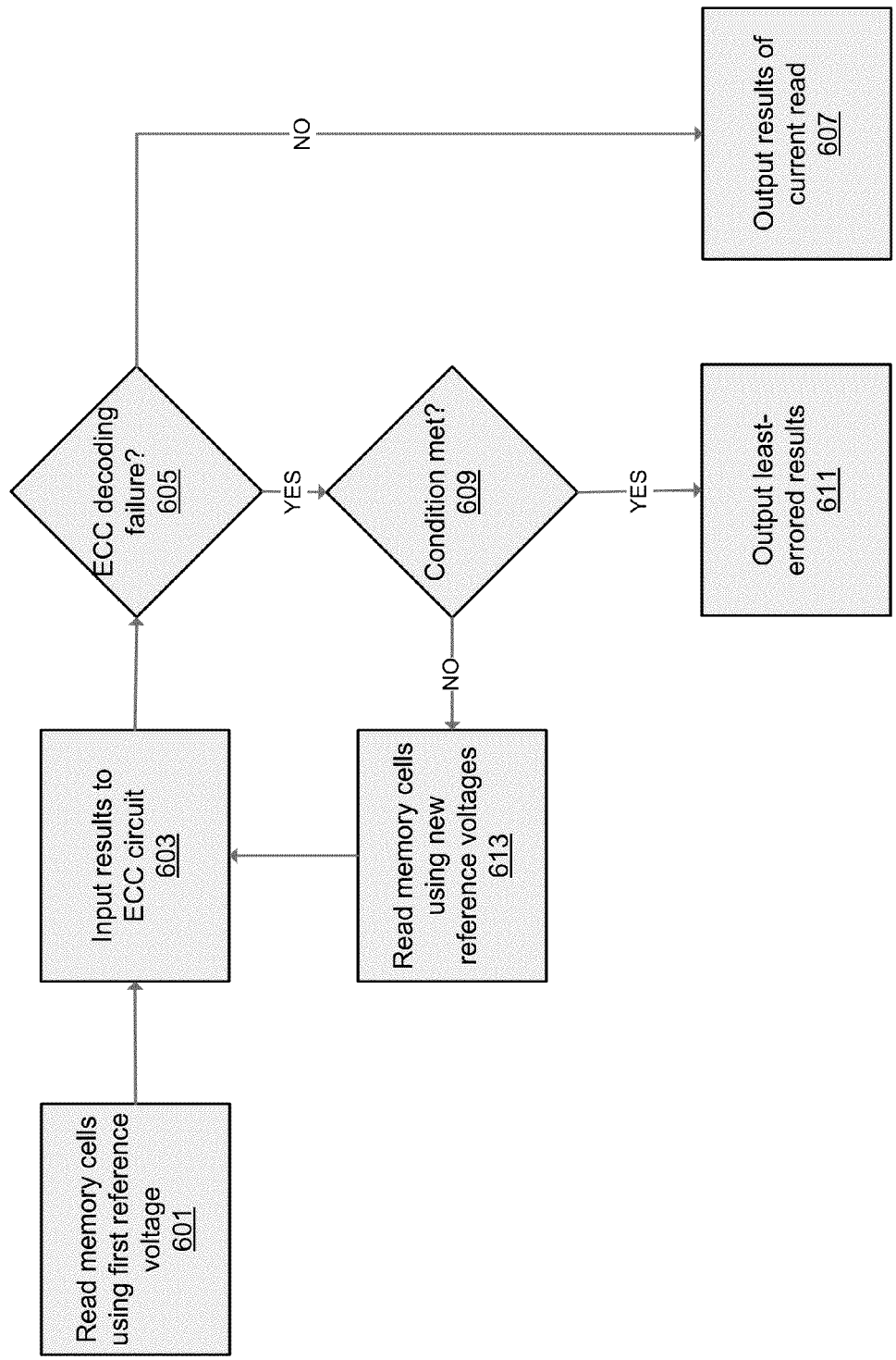
FIG. 6 illustrates performing a progressive read operation for a memory device in accordance with various embodiments.

FIG. 6 illustrates performing a progressive read operation on a memory device in accordance with various embodiments. At 601, a read operation may be performed on a group of memory cells (such as for example a page of memory cells or other grouping) using a first reference voltage. At 603, the results of the read operations may be input into an Error Correction Code (ECC) circuit. At 605, the ECC circuit may detect and/or correct errors in the read results. At 607, if there is no ECC decoding failure, then the results of the read may be output.

At 609, if, however, there is an ECC decoding failure, another condition may be checked. The other condition may be that a maximum number of reads has already been performed during the current progressive read operation. The condition may be that more than a maximum amount of time has been used to perform the current progressive read operation. At 611, if the condition is met, then the least-errored result of any previous read of the current progressive read operation is output. Alternatively, the ECC circuit may be configured to perform quantization of multiple read operations using multiple reference voltages and to output results based on the quantization as described below in reference to FIG. 7.

At 613, if at 609 the condition is not met, then a new read is performed on the memory cells using one or more new reference voltages, and, at 603, the new results are input into the ECC circuit. The process will repeat until either at 611 the least-errored results are output, or at 607 error-free results are output.

In a further refinement, results from multiple read operations may be utilized to perform quantization of the read results. For example, if reference voltage $V_R$ is used to perform a "normal" read—such as may be used in the first read operation from 601 in FIG. 6—then two additional reference voltages $V_X$ and $V_{1-X}$, as defined below, may be used to perform two more read operations for purposes of quantizing the results.

Figure 7:
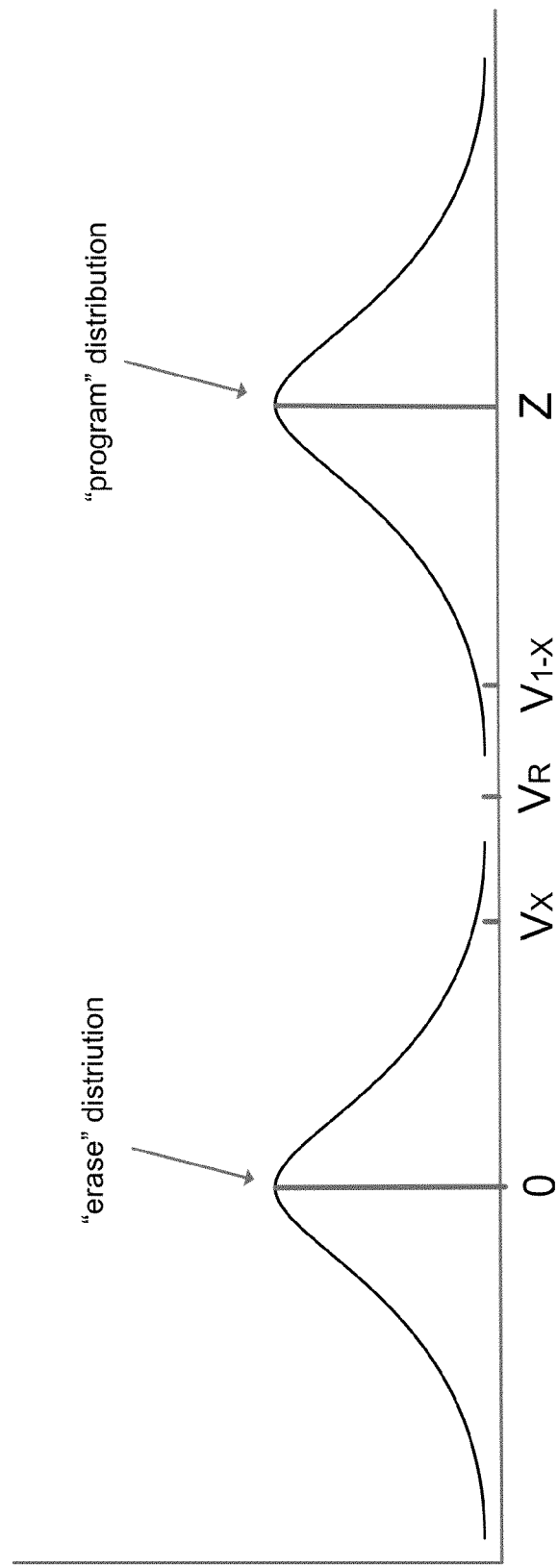
FIG. 7 depicts two voltage threshold distributions and the corresponding reference voltages that may be used to perform two-bit quantization of the read results.

FIG. 7 depicts two voltage threshold distributions and the corresponding reference voltages that may be used to perform two-bit quantization of the read results. The two distributions in FIG. 7 correspond to an "erase" distribution and to a "program" distribution. After an initial read using reference voltage $V_R$, two more reads may be performed using $V_X$ and $V_{1-X}$, which are defined as follows:

$$V_X = z \cdot x \qquad \text{Equation 1}$$

$$V_{1-X} = z \cdot (1-x) \qquad \text{Equation 2}$$

Where $0<x<1$, and x is a real positive number. The reads performed using $V_X$ and $V_{1-X}$ are combined along with the read results using $V_R$ to perform two-bit quantization as depicted in the following table. Each column in the table represents a combination of read results, and the last cell of each column represents the quantized value that results from a particular combination of read results.

| $V_{1-x}$ read result | 1 | 1 | 1 | 1 | 0 | 0 | 0 | 0 |
|---|---|---|---|---|---|---|---|---|
| $V_R$ read result | 1 | 1 | 0 | 0 | 1 | 1 | 0 | 0 |
| $V_x$ read result | 1 | 0 | 1 | 0 | 1 | 0 | 1 | 0 |
| Quantized Value | 0 | $V_1$ | N/A | $V_2$ | N/A | N/A | N/A | z |

Where N/A in the last cell of a column indicates that the particular combination associated with that column is not possible (or would be unintelligible) and where $V_1$ and $V_2$ are given by:

$$V_1 = (V_X + V_R)/2 \qquad \text{Equation 3}$$

$$V_2 = (V_R + V_{1-X})/2 \qquad \text{Equation 4}$$

A soft decoder—for example a convolution code decoder, Low-density parity check (LDPC) decoder, Turbo code decoder, or other decoder—is configured to utilize the two-bit quantization output to improve the decoding performance compared with the case where only a single bit quantization is utilized. If the decoding still fails after performing the two-bit quantization, additional reads utilizing further reference voltages can be performed to increase the resolution even further to achieve three-bit, four-bit, or other quantization levels.

Thus, additional reads are performed on demand, such as when ECC decoding fails. Performing the additional reads on demand may incur less latency and overhead than if multiple read voltages were always used for every read operation. The first read will be successful far more often than not, and successive read operations will usually be unnecessary.

Figure 8:
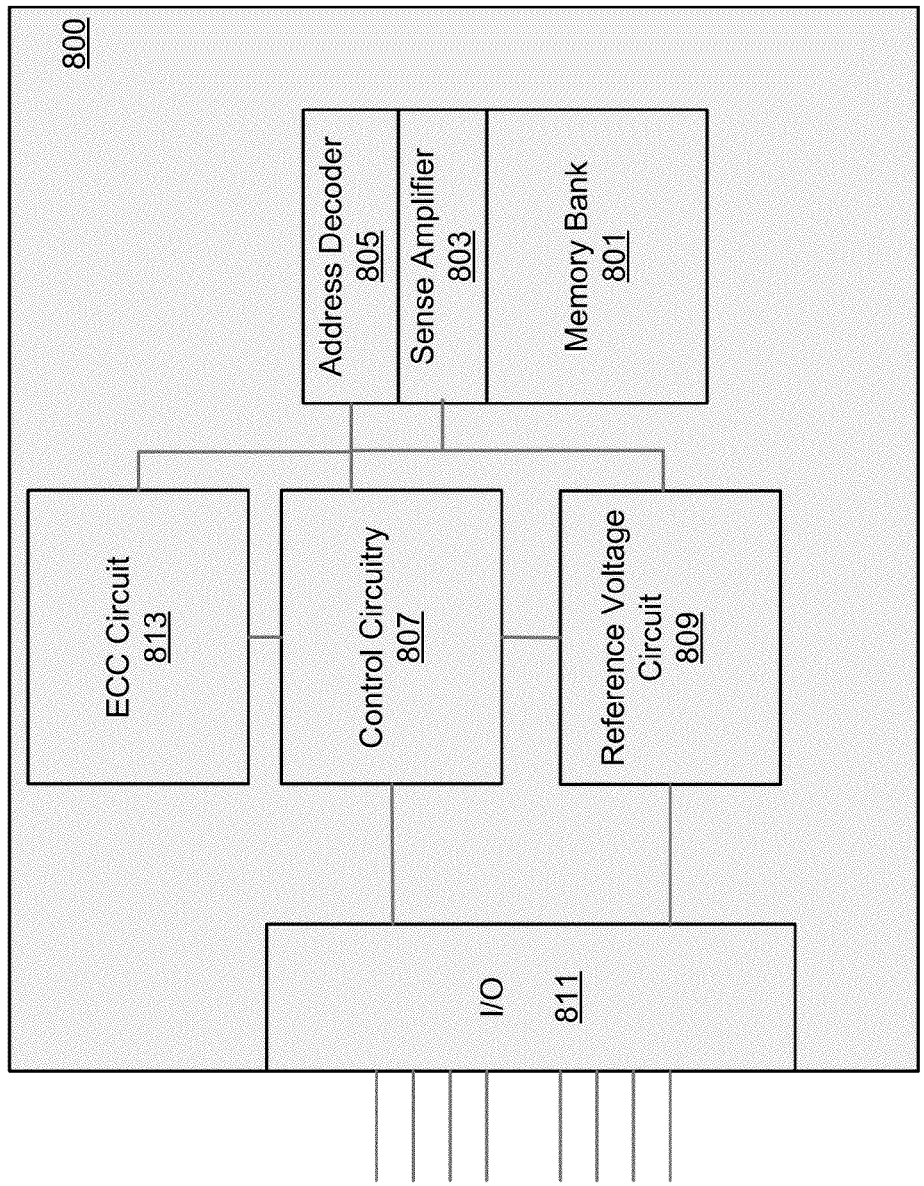
FIG. 8 illustrates a memory device configured to perform a progressive read in accordance with various embodiments.

FIG. 8 illustrates a memory device 800 configured to perform a progressive read in accordance with various embodiments. Memory device 800 may include memory bank 801 coupled to sense amplifier 803 and address decoder 805. Memory device 800 may include control circuitry 807, reference voltage circuit 809, and I/O 811. Memory device 800 may include ECC circuit 813 configured to accept as input read results from sense amplifier 803 and to detect and/or correct any errors in the read results; ECC circuit 813 may be configured to determine whether there has been an ECC decoding failure. Control circuitry 807 is configured to determine, based at least in part upon whether there has been an ECC decoding failure, whether to cause sense amplifier 803 to re-read the memory cells using a new reference voltage, such as may be provided by reference voltage circuit 809. Control circuitry 807 may also be configured to determine, if there has been an ECC decoding failure, whether to perform another read based at least on whether another condition is met. This other condition may be, for example, whether a maximum number of reads has already been performed for the current progressive read operation; or the condition may be that more than a maximum amount of time has transpired during the current progressive read operation. Control circuitry 807 may be configured to output either the current read results or the least-errored results from the previous read results of the current read operation. ECC circuit 813 may be configured to perform x-bit quantization of multiple read results such as is described above in relation to FIG. 7.

Memory controllers may be employed to perform various operations described within this Detailed Description. For example, error correction and/or error detection may be performed by a memory controller rather than using an error correction/detection circuit within a memory device.

Figure 9:
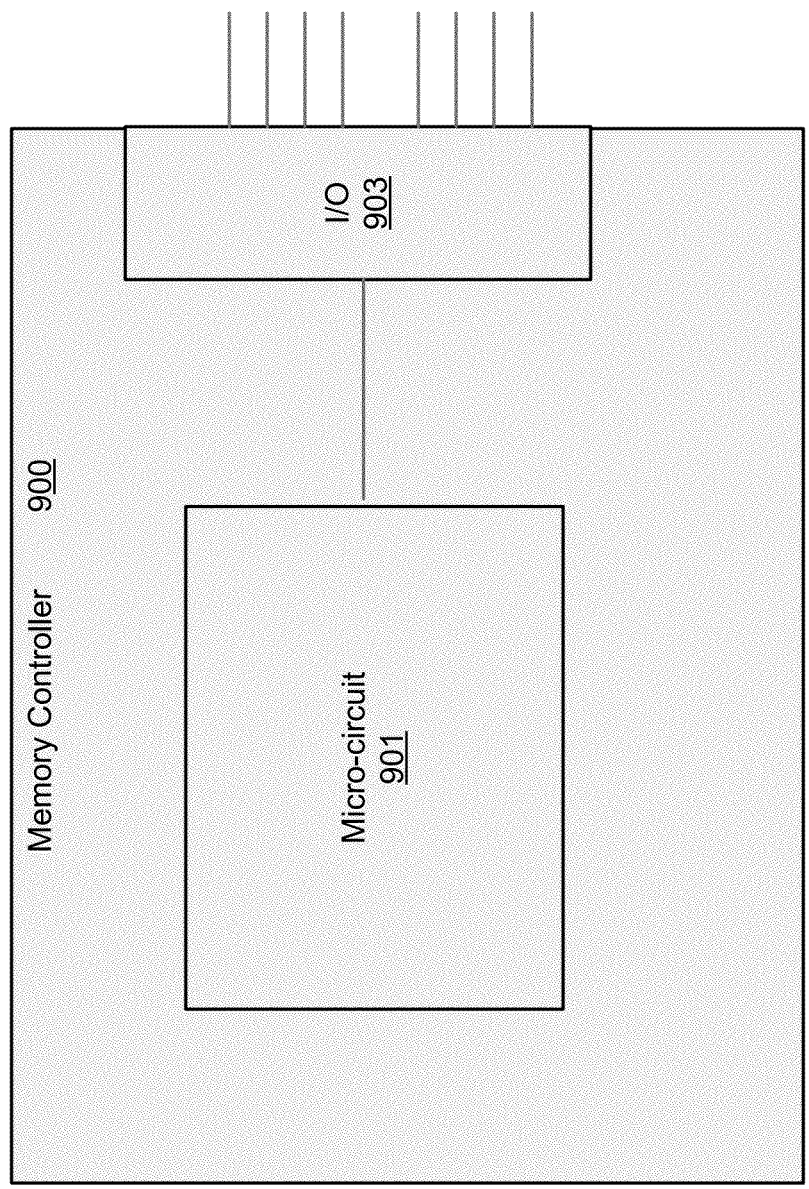
FIG. 9 illustrates a memory controller configured to interface with a memory device in accordance with various embodiments.

FIG. 9 illustrates a memory controller 900 configured to interface with a memory device in accordance with various embodiments. Memory controller 900 may include micro-circuit 901 configured to perform various operations as described elsewhere within this Detailed Description. Memory controller 900 may be, for example, configured to interface with a memory device via I/O 903 on behalf of a CPU or other component. Micro-circuit 901 may be configured to determine threshold voltage distributions within a memory device. Micro-circuit 901 may be configured to determine an ideal or near-ideal reference voltage for performing operations—such as read operations—using a determined threshold voltage distribution. Micro-circuit 901 may be configured to provide a voltage reference signal to the memory device as either an analog or a digital signal. These voltage reference signals may be used for either comparison purposes to determine an ideal or near-ideal reference voltage for use in read operations, or may be used for the actual read operations themselves. Micro-circuit 901 may be configured to receive the results of a read operation, perform error correction, and/or initiate another read using another reference voltage if there is an ECC decoding failure. Micro-circuit 901 may be configured to perform these and other various operations described within this Detailed Description.

Figure 10:
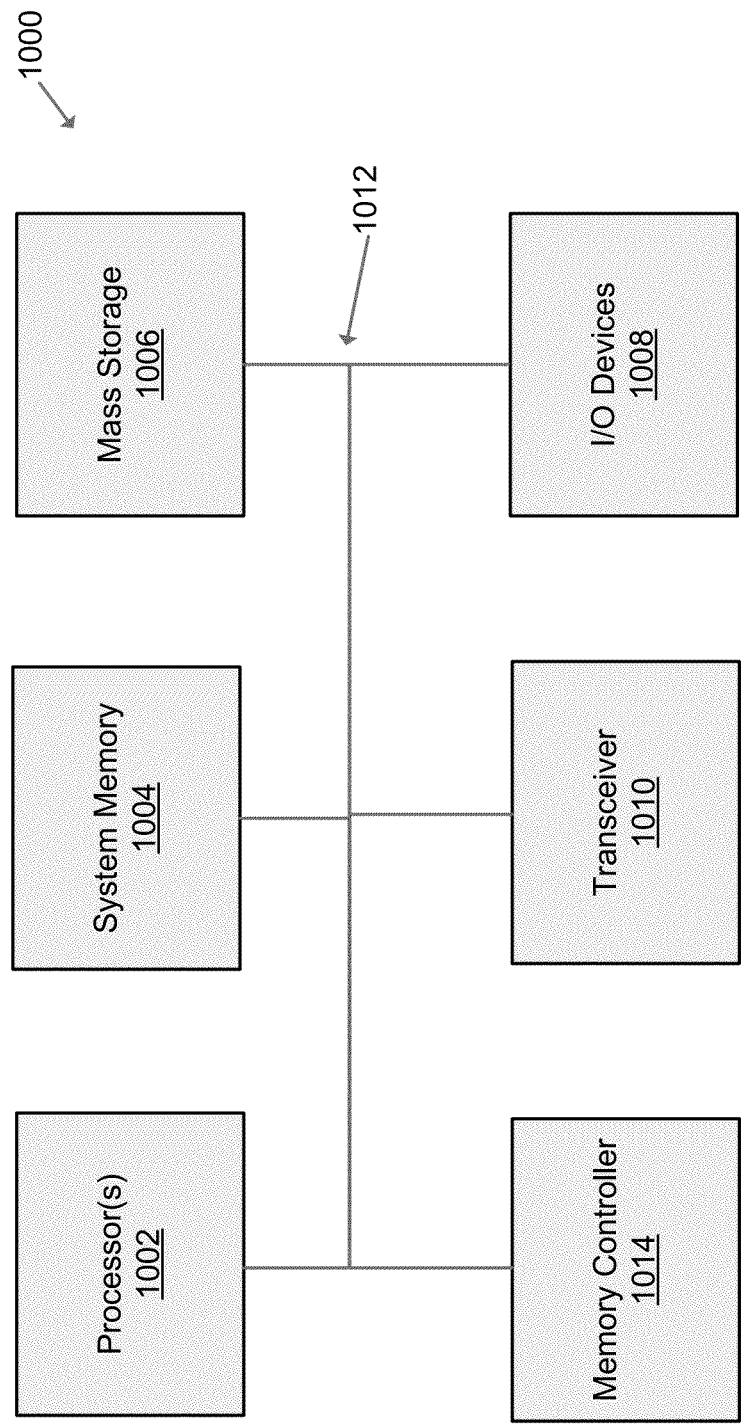
FIG. 10 illustrates a computing system configured according to various embodiments.

FIG. 10 illustrates a computing system configured according to various embodiments. As shown, computing system 1000 includes one or more processors 1002, and system memory 1004. Additionally, computing system 1000 includes mass storage devices 1006, such as a diskette drive, hard drive, CDROM, flash memory and so forth. Computing system 1000 includes input/output devices 1008 (such as a keyboard, cursor control, and so forth), and transceiver 1010 (such as network interface cards, modems and so forth). Computing system 1000 also includes memory controller 1014. The elements are coupled to each other via system bus 1012, which represents one or more buses. In the case of multiple buses, they may be bridged by one or more bus bridges (not shown). System memory 1004 and/or mass storage devices 1006 may be configured as is described elsewhere within this Detailed Description.

Each of these elements may perform its conventional functions known in the art. Also, one or more software modules (not shown) may be executed by processor(s) 1002, memory controller 1014, system memory 1004, and/or mass storage 1006 to practice or contribute to the practice of the methods described herein such as to determine a threshold voltage reference distribution of system memory 1004 or mass storage device 1006 (especially where system memory 1004 and/or mass storage device 1006 are flash memories). Such software modules may be placed into mass storage 1006 of computing system 1000, or elsewhere. The placement may be made in the factory, or in the field, through, for example, a distribution medium (not shown), such as a compact disc (CD), Digital Versatile Disc (DVD), or through transceiver 1010 (from a distribution server (not shown)). In embodiments, the distribution medium may be an article of manufacture having programming instructions configured to implement one or more aspects of one or more methods as disclosed herein. More specifically, the article of manufacture may comprise a computer readable-storage medium having a plurality of programming instructions stored in the storage medium. The programming instructions may then be read or loaded into a computer system to practice or contribute to the practice of the methods described herein to implement the software module(s).

In various embodiments, computer system 1000 may be a server, a desktop computer, a laptop computer, a tablet computer, or a smart phone. In other embodiments, computer system 1000 may be embedded in a media player, a game console, a set-top box, diskless workstation, a digital recorder, or other device. Computer system 1000 may be a mobile device.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention.

Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A controller for a memory bank, wherein the memory bank comprises a plurality of flash memory cells, wherein the controller comprises control circuitry coupled to (i) a voltage generator, and (ii) the memory bank, wherein the voltage generator is configured to generate a plurality of reference voltages, and wherein the control circuitry is configured to:
   command the memory bank to iteratively perform read operations on the plurality of flash memory cells until a condition is met, wherein (i) each iteration of the read operations utilizes a different one of the plurality of reference voltages generated by the voltage generator, and (ii) the iteratively-performed read operations produce two or more read results; and
   synthesize two or more of the read results to determine data for output.

2. The controller of claim 1, wherein the control circuitry is configured to synthesize two or more of the read results by at least quantizing the two or more read results.

3. The controller of claim 1, wherein:
   the data for output includes, for each bin of a plurality of bins, a number of flash memory cells of the plurality of flash memory cells having threshold voltages that fall within the bin; and
   the plurality of bins represents a plurality of threshold voltage ranges.

4. The controller of claim 3, wherein a boundary between at least two of the bins is defined by one of the plurality of reference voltages.

5. The controller of claim 3, wherein the control circuitry is further configured to, based at least in part on the number of flash memory cells that fall into each of the bins, calculate a threshold voltage distribution of the plurality of flash memory cells.

6. The controller of claim 5, wherein:
   calculating the threshold voltage distribution comprises calculating (i) a mean of the threshold voltage distribution, and (ii) a standard deviation of the threshold voltage distribution; and
   the control circuitry is further configured to
      based at least on one or more of (i) the determined mean of the threshold voltage distribution, and (ii) the determined standard deviation of the threshold voltage distribution, calculate an ideal or near-ideal reference voltage, and
      using the ideal or near-ideal reference voltage, perform an operation on at least one of the plurality of memory cells.

7. The controller of claim 5, wherein calculating a threshold voltage is further based at least in part on known storage levels of the plurality of flash memory cells.

8. The controller of claim 1, wherein the condition comprises at least success in decoding an error correction code (ECC).

9. A memory device comprising:
   a memory bank comprising a plurality of flash memory cells; and
   a controller comprising control circuitry coupled to (i) a voltage generator, and (ii) the memory bank, wherein the control circuitry is configured to
      command the memory bank to iteratively perform read operations on the plurality of flash memory cells until a condition is met, wherein (i) each iteration of the read operations utilizes a different one of a plurality of reference voltages generated by the voltage generator, and (ii) the iteratively-performed read operations produce two or more read results, and
      synthesize two or more of the read results to determine data for output.

10. The memory device of claim 9, wherein the control circuitry is configured to synthesize two or more of the read results by at least quantizing the two or more read results.

11. The memory device of claim 9, wherein:
   the data for output includes, for each bin of a plurality of bins, a number of flash memory cells having threshold voltages that fall within the bin; and
   the plurality of bins represents a plurality of threshold voltage ranges.

12. The memory device of claim 11, wherein a boundary between at least two of the bins is defined by one of the plurality of reference voltages.

13. The memory device of claim 11, wherein the control circuitry is further configured to, based at least in part on the number of flash memory cells that fall into each of the bins, calculate a threshold voltage distribution of the plurality of flash memory cells.

14. The memory device of claim 13, wherein:
calculating a threshold voltage distribution comprises calculating (i) a mean of the threshold voltage distribution, and (ii) a standard deviation of the threshold voltage distribution;
the control circuitry is further configured to
based at least on one or more of (i) the determined mean of the threshold voltage distribution, and (ii) the determined standard deviation of the threshold voltage distribution, calculate an ideal or near-ideal reference voltage, and
using the ideal or near-ideal reference voltage, perform an operation on at least one of the plurality of memory cells.

15. The memory device of claim 13, wherein calculating a threshold voltage is further based at least in part on known storage levels of the plurality of flash memory cells.

16. The memory device of claim 9, wherein the condition comprises at least success in decoding an error correction code (ECC).

17. The memory device of claim 9, further comprising the voltage generator coupled to the memory bank, wherein the voltage generator is further configured to provide the memory bank with the plurality of reference voltages.

18. The memory device of claim 17, wherein:
the voltage generator includes a digital-to-analog-converter;
the digital-to-analog converter is configured to (i) accept digital inputs, and (ii) generate analog voltages corresponding to the digital inputs; and
the analog voltages serve as the plurality of reference voltages.

* * * * *